United States Patent
Kurita et al.

(10) Patent No.: US 10,224,318 B2
(45) Date of Patent: *Mar. 5, 2019

(54) ELECTRONIC DEVICE

(71) Applicant: Renesas Electronics Corporation, Tokyo (JP)

(72) Inventors: Yoichiro Kurita, Tokyo (JP); Masaya Kawano, Tokyo (JP); Koji Soejima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/714,712

(22) Filed: Sep. 25, 2017

(65) Prior Publication Data

US 2018/0019237 A1 Jan. 18, 2018

Related U.S. Application Data

(60) Continuation of application No. 15/354,484, filed on Nov. 17, 2016, now Pat. No. 9,847,325, which is a continuation of application No. 15/191,774, filed on Jun. 24, 2016, which is a continuation of application No. 14/606,425, filed on Jan. 27, 2015, now Pat. No. 9,406,602, which is a continuation of application No. 14/455,336, filed on Aug. 8, 2014, now Pat. No.
(Continued)

(30) Foreign Application Priority Data

Oct. 2, 2006 (JP) .................. 2006-271154

(51) Int. Cl.
*H01L 23/48* (2006.01)
*H01L 23/52* (2006.01)
(Continued)

(52) U.S. Cl.
CPC ............ *H01L 25/50* (2013.01); *H01L 21/568* (2013.01); *H01L 21/6835* (2013.01);
(Continued)

(58) Field of Classification Search
None
See application file for complete search history.

(56) References Cited

U.S. PATENT DOCUMENTS 5,375,042 A 12/1994 Arima et al.
5,608,265 A 3/1997 Kitano et al.
(Continued)

FOREIGN PATENT DOCUMENTS

CN 1491439 4/2004
JP 57-007147 1/1982
(Continued)

OTHER PUBLICATIONS

Japanese Office Action for Application No. 2018-078351, dated Aug. 7, 2018, with English translation provided.
(Continued)

*Primary Examiner* — Calvin Y Choi
(74) *Attorney, Agent, or Firm* — Young & Thompson

(57) ABSTRACT

In a conventional electronic device and a method of manufacturing the same, reduction in cost of the electronic device is hindered because resin used in an interconnect layer on the solder ball side is limited. The electronic device includes an interconnect layer (a first interconnect layer) and an interconnect layer (a second interconnect layer). The second interconnect layer is formed on the undersurface of the first interconnect layer. The second interconnect layer is larger in area seen from the top than the first interconnect layer and is extended to the outside from the first interconnect layer.

16 Claims, 16 Drawing Sheets

Related U.S. Application Data 8,975,750, which is a continuation of application No. 14/108,960, filed on Dec. 17, 2013, now Pat. No. 8,823,174, which is a division of application No. 13/712,224, filed on Dec. 12, 2012, now Pat. No. 8,633,591, which is a division of application No. 11/865,745, filed on Oct. 2, 2007, now Pat. No. 8,354,340.

(51) Int. Cl.

| | | |
|---|---|---|
| *H01L 29/40* | (2006.01) | |
| *H01L 21/00* | (2006.01) | |
| *H01L 21/30* | (2006.01) | |
| *H01L 21/46* | (2006.01) | |
| *H01L 21/4763* | (2006.01) | |
| *H01L 25/00* | (2006.01) | |
| *H01L 21/683* | (2006.01) | |
| *H01L 23/13* | (2006.01) | |
| *H01L 23/00* | (2006.01) | |
| *H05K 3/00* | (2006.01) | |
| *H05K 3/46* | (2006.01) | |
| *H01L 23/538* | (2006.01) | |
| *H01L 23/498* | (2006.01) | |
| *H01L 23/522* | (2006.01) | |
| *H01L 21/56* | (2006.01) | |
| *H01L 25/065* | (2006.01) | |
| *H01L 25/18* | (2006.01) | |
| *H01L 23/31* | (2006.01) | |
| *H01L 25/16* | (2006.01) | |
| *H05K 3/28* | (2006.01) | |

(52) U.S. Cl.
CPC ........ *H01L 23/13* (2013.01); *H01L 23/49816* (2013.01); *H01L 23/522* (2013.01); *H01L 23/5226* (2013.01); *H01L 23/5383* (2013.01); *H01L 23/5384* (2013.01); *H01L 23/5386* (2013.01); *H01L 24/02* (2013.01); *H01L 24/16* (2013.01); *H01L 25/0657* (2013.01); *H01L 25/18* (2013.01); *H05K 3/0058* (2013.01); *H05K 3/4682* (2013.01); *H01L 23/3121* (2013.01); *H01L 25/0652* (2013.01); *H01L 25/16* (2013.01); *H01L 2221/68345* (2013.01); *H01L 2221/68372* (2013.01); *H01L 2224/02319* (2013.01); *H01L 2224/02331* (2013.01); *H01L 2224/02333* (2013.01); *H01L 2224/02372* (2013.01); *H01L 2224/02373* (2013.01); *H01L 2224/02379* (2013.01); *H01L 2224/02381* (2013.01); *H01L 2224/16137* (2013.01); *H01L 2224/16146* (2013.01); *H01L 2224/16225* (2013.01); *H01L 2224/16235* (2013.01); *H01L 2224/16238* (2013.01); *H01L 2224/17181* (2013.01); *H01L 2224/32145* (2013.01); *H01L 2224/32225* (2013.01); *H01L 2224/73204* (2013.01); *H01L 2224/81005* (2013.01); *H01L 2224/83005* (2013.01); *H01L 2225/06513* (2013.01); *H01L 2225/06544* (2013.01); *H01L 2225/06555* (2013.01); *H01L 2225/06582* (2013.01); *H01L 2924/00011* (2013.01); *H01L 2924/00014* (2013.01); *H01L 2924/01079* (2013.01); *H01L 2924/09701* (2013.01); *H01L 2924/12042* (2013.01); *H01L 2924/14* (2013.01); *H01L 2924/1532* (2013.01); *H01L 2924/15192* (2013.01); *H01L 2924/15311* (2013.01); *H01L 2924/18161* (2013.01); *H01L 2924/19015* (2013.01); *H01L 2924/19041* (2013.01); *H01L 2924/19105* (2013.01); *H05K 3/284* (2013.01); *H05K 2201/0195* (2013.01); *H05K 2201/096* (2013.01); *H05K 2201/09527* (2013.01); *H05K 2201/09972* (2013.01); *H05K 2203/016* (2013.01); *H05K 2203/0733* (2013.01); *H05K 2203/1469* (2013.01)

(56) References Cited

U.S. PATENT DOCUMENTS

| | | | |
|---|---|---|---|
| 6,204,074 | B1 | 3/2001 | Bertolet et al. |
| 6,376,917 | B1 | 4/2002 | Takeshita et al. |
| 6,661,088 | B1 | 12/2003 | Yoda et al. |
| 6,762,488 | B2 | 7/2004 | Maeda et al. |
| 7,158,344 | B2 | 1/2007 | Sato |
| 7,385,281 | B2 | 6/2008 | Nishio et al. |
| 7,388,293 | B2 | 6/2008 | Fukase et al. |
| 7,415,762 | B2 | 8/2008 | Fukase et al. |
| 7,528,476 | B2 | 5/2009 | Ito |
| 7,795,721 | B2 | 9/2010 | Kurita |
| 8,064,222 | B2 | 11/2011 | Nishio et al. |
| 8,193,033 | B2 | 6/2012 | Kurita |
| 8,207,605 | B2 | 6/2012 | Kurita |
| 8,354,340 | B2 | 1/2013 | Kurita et al. |
| 8,541,874 | B2 | 9/2013 | Kurita |
| 8,633,591 | B2 | 1/2014 | Kurita et al. |
| 8,823,174 | B2 | 9/2014 | Kurita et al. |
| 8,975,750 | B2 | 3/2015 | Kurita et al. |
| 9,406,602 | B2 | 8/2016 | Kurita et al. |
| 9,847,325 | B2 | 12/2017 | Kurita et al. |
| 2003/0036260 | A1 | 2/2003 | Nakamura |
| 2003/0062612 | A1 | 4/2003 | Matsuo et al. |
| 2003/0157810 | A1 | 8/2003 | Honda |
| 2003/0168256 | A1 | 9/2003 | Chien |
| 2004/0056344 | A1 | 3/2004 | Ogawa et al. |
| 2005/0130413 | A1 | 6/2005 | Shimoto et al. |
| 2005/0167717 | A1 | 8/2005 | Yang et al. |
| 2007/0057375 | A1 | 3/2007 | Nakamura |
| 2007/0132080 | A1 | 6/2007 | Nakashima |
| 2013/0334705 | A1 | 12/2013 | Kurita |
| 2016/0307875 | A1 | 10/2016 | Kurita et al. |
| 2017/0287853 | A1 | 10/2017 | Kim et al. |
| 2018/0019237 | A1 | 1/2018 | Kurita et al. |

FOREIGN PATENT DOCUMENTS

| | | |
|---|---|---|
| JP | 4-207065 | 7/1992 |
| JP | 6-268101 | 9/1994 |
| JP | 09-321408 | 12/1997 |
| JP | 11-126978 | 5/1999 |
| JP | 2001-024150 | 1/2001 |
| JP | 2001-053413 | 2/2001 |
| JP | 2001-102479 | 4/2001 |
| JP | 2002-343931 | 11/2002 |
| JP | 2003-163323 | 6/2003 |
| JP | 2003-179053 | 6/2003 |
| JP | 2003-264368 | 9/2003 |
| JP | 2003-273317 | 9/2003 |
| JP | 2003-309215 | 10/2003 |
| JP | 2004-179295 | 6/2004 |
| JP | 2005-072328 | 3/2005 |
| JP | 2005-191172 | 7/2005 |
| JP | 2006-019368 | 1/2006 |
| JP | 2006-19433 | 1/2006 |
| JP | 2006-73777 | 3/2006 |
| JP | 2006-179562 | 7/2006 |
| JP | 2008-91638 | 4/2008 |
| JP | 2016-25198 | 2/2016 |
| JP | 2017-188645 | 10/2017 |
| WO | WO 2005/029578 | 3/2005 |

OTHER PUBLICATIONS

Japanese Office Action dated Mar. 6, 2018 in corresponding Japanese Patent Application No. 2017-239172 with English translation of Japanese Office Action.

(56) References Cited

OTHER PUBLICATIONS

Japanese Notification of Reasons for Refusal dated Aug. 2, 2011 in corresponding Japanese Application No. 2006-271154 with English Translation of the Japanese office Action.
Chinese Patent Office issued a Chinese Office Action dated Jul. 31, 2009, Application No. 2007101499816.
Japanese Office Action dated May 14, 2013 in corresponding Japanese Patent Application No. 2012-182958 with English translation of Japanese Office Action.
Japanese Official Action—2012-182958—dated Dec. 17, 2013.
Japanese Office Action dated Mar. 29, 2016 in corresponding Japanese Patent Application No. 2015-095858 with English translation of Japanese Office Action.
Japanese Office Action dated Mar. 14, 2017 in corresponding Japanese Patent Application No. 2015-095858 with English translation of Japanese Office Action.
Japanese Office Action dated Jun. 12, 2018 in corresponding Japanese Patent Application No. 2017-239172 with English translation of Japanese Office Action.
Japanese Office Action dated Oct. 3, 2017 in corresponding Japanese Patent Application No. 2016-247608 with English translation of Japanese Office Action.
Japanese Office Action issued in Application No. 2017-239172, dated Oct. 2, 2018, with English translation.
Japanese Office Action for Application No. 2018-239172, dated Oct. 2, 2018, with English translation provided.
Japanese Office Action issued in Application No. 2018-078351, dated Dec. 11, 2018 with English Translation.

ELECTRONIC DEVICE

This application is based on Japanese patent application NO. 2006-271154, the content of which is incorporated hereinto by reference.

BACKGROUND

Technical Field

The present invention relates to an electronic device and a method of manufacturing the same.

Related Art

As a known method of manufacturing an electronic device, for example, there is provided one which is disclosed in Japanese Laid-open patent publication No. 2003-309215. In a manufacturing method described in the same document, a multilayer interconnect layer is formed by laminating a plurality of interconnect layers on a supporting substrate, and then, the supporting substrate is removed. Then, a solder ball is formed as an external electrode terminal on one surface of the multilayer interconnect layer which is exposed by the removal of the supporting substrate. Furthermore, electronic components are mounted in a flip chip configuration on the other surface of the multilayer interconnect layer. This can obtain an electronic device on which electronic components are placed on the multilayer interconnect layer.

In addition, as conventional art documents related to the present invention, there may be included Japanese Laid-open patent publication Nos. 57-7147, 9-321408, 11-126978, 2001-53413 in addition to Japanese Laid-open patent publication No. 2003-309215.

By the way, in the above electronic device, in order to perform microscopic connection between the interconnect layer and the electronic component, resin suitable for micromachining is required to be used in an interconnect layer on the electronic component side in the interconnect layers which constitute the multilayer interconnect layer. On the other hand, there are many cases where the resin suitable for micromachining is not required to be used in an interconnect layer on the solder ball side. In this case, it is preferable to use resin with relatively low cost in the interconnect layer on the solder ball side to reduce costs of the electronic device.

However, in the manufacturing method disclosed in Japanese Laid-open patent publication No. 2003-309215, as described above, the multilayer interconnect layer is formed by laminating a plurality of interconnect layers in order on the supporting substrate. Therefore, the interconnect layer on the solder ball side is formed prior to forming the interconnect layer on the electronic component side. As a result, there is a restriction in that resin which is lower in decomposition temperature than the resin which constitutes the interconnect layer on the electronic component side cannot be used as the resin which constitutes the interconnect layer on the solder ball side. The resin for use in the interconnect layer on the solder ball side is limited for such a restriction, and accordingly, reduction in cost of the electronic device is hindered.

SUMMARY

In one embodiment, there is provided a method of manufacturing an electronic device, including: forming a first interconnect layer on a supporting substrate; removing said supporting substrate; and forming a second interconnect layer, said second interconnect layer extending to further outside than said first interconnect layer being formed on a surface of said first interconnect layer where said supporting substrate is removed.

There is provided a method of manufacturing an electronic device, including: wherein in the step of said forming second interconnect layer, a resin which is lower is in decomposition temperature than a resin which constitutes said first interconnect layer is used as a resin which constitutes said second interconnect layer. Therefore, resin suitable for micromachining can be used in the first interconnect layer; on the other hand, resin with relatively low cost can be used in the second interconnect layer.

Furthermore, in one embodiment, there is provided an electronic device including: a first interconnect layer; and a second interconnect layer which is provided on the first interconnect layer and extended to further outside than the first interconnect layer.

In this electronic device, as a resin which constitutes the second interconnect layer, resin which is lower in decomposition temperature than resin which constitutes the first interconnect layer can be used. Therefore, resin suitable for micromachining can be used in the first interconnect layer; on the other hand, resin with relatively low cost can be used in the second interconnect layer.

According to the present invention, there can be implemented an electronic device and a method of manufacturing the same, both of which are capable of obtaining microscopic connection between an interconnect layer and an electronic component with low cost.

BRIEF DESCRIPTION OF THE DRAWING

The above and other objects, advantages and features of the present invention will be more apparent from the following description of certain preferred embodiments taken in conjunction with the accompanying drawings, in which.

DETAILED DESCRIPTION

Figure 1:
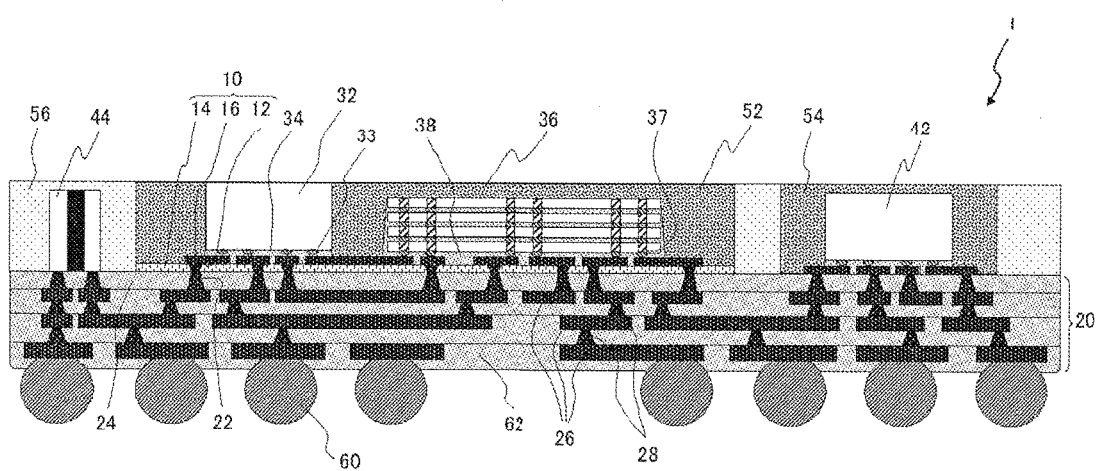
FIG. 1 is a cross-sectional view showing a first embodiment of an electronic device according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferred embodiments of electronic devices and methods of manufacturing the same according to the present invention will be described in detail below with reference to the drawings. In addition, the same reference numerals are given to those identical to constitutional elements in the description of the drawings and their detail description will not be repeated.

First Embodiment

FIG. 1 is a cross-sectional view showing a first embodiment of an electronic device according to the present invention. An electronic device 1 includes an interconnect layer 10 (a first interconnect layer) and an interconnect layer 20 (a second interconnect layer).

The interconnect layer 10 has a via plug 12 (a first conductive plug), an insulation resin 14, and conductor interconnect 16. The via plug 12 is formed in the insulation resin 14. As can be seen from the drawing, the via plug 12 is of a tapered shape which becomes smaller in diameter as approaching to the interconnect layer 20. Therefore, an end surface area on the interconnect layer 20 side of the via plug 12 is smaller than an end surface area opposite thereto, that is, an end surface area on the IC chip 32 and 36 sides (to be described later).

A conductor of the via plug 12 is Cu, Ni, Au, or Ag, for example. The insulation resin 14 is, for example, polyimide resin, polybenzoxazole (referred to as PBO) resin, benzocyclobutene (referred to as BCB) resin, cardo resin (cardotype polymer), or epoxy resin. The polyimide resin may be photosensitive polyimide resin, or non-photosensitive polyimide resin. The conductor interconnect 16 connected to the via plug 12 is formed on the insulation resin 14.

The IC chips 32 and 36 (electronic components) are placed on an upper surface (a first surface) of the interconnect layer 10. Each of the IC chips 32 and 36 is connected in a flip chip configuration to the conductor interconnect 16 via bumps 33 and 37. An underfill resin 34 is filled in a gap between the IC chip 32 and the interconnect layer 10. In the same way, an underfill resin 38 is filled in a gap between the IC chip 36 and the interconnect layer 10. The IC chip 36 is provided in plural number, and those chips are laminated with each other. The IC chip 32 and the IC chip 36 are a CPU and a laminated memory, respectively. The laminated memory is one in which an IC chip (memory) is three-dimensionally laminated and electrically connected between the chips (memories).

In addition, the IC chips 32 and 36 are covered with a sealing resin 52 formed on the interconnect layer 10. In more detail, side surfaces of the IC chip 32, side surfaces and an upper surface of the IC chip 36 are covered with the sealing resin 52.

The interconnect layer 20 is formed on an undersurface (a second surface) of the interconnect layer 10. The interconnect layer 20 is larger in area seen from the top than the interconnect layer 10 and is extended to further outside than the interconnect layer 10. That is, the interconnect layer 20 is protruded from the interconnect layer 10.

The interconnect layer 20 has a via plug 22 (a second conductive plug) and an insulation resin 24. The via plug 22 is formed in the insulation resin 24. The via plug 22 is connected to the above mentioned via plug 12. As can be seen from the drawing, the via plug 22 is of a tapered shape which becomes smaller in diameter as approaching to the interconnect layer 10. Therefore, an end surface area on the interconnect layer 10 side of the via plug 22 is smaller than an end surface area opposite thereto, that is, an end surface area on solder ball 60 sides. A conductor of the via plug 22 is, for example, Cu, Ni, Au, or Ag, as in the via plug 12. Furthermore, the insulation resin 24 is, for example, epoxy resin or the like. An interconnect body composed of the above mentioned interconnect layer 10 and interconnect layer 20 functions as an interposer in the electronic device 1.

Decomposition temperature of the insulation resin 14 which constitutes the interconnect layer 10 is higher than that of the insulation resin 24 which constitutes the interconnect layer 20. In case of using PBO as the insulation resin 14, its decomposition temperature is 540° C., for example. Furthermore, in case of using epoxy resin as the insulation resin 24, its decomposition temperature is 310° C., for example. In this case, the decomposition temperature is a temperature at the time when the resin weight is reduced by 5 wt % when measured with a thermobalance at a rate of temperature increase of 10° C./min. In addition, even when the same type of resin (for example, epoxy resin) is used as the insulation resins 14 and 24, the former is higher in decomposition temperature than the latter.

An IC chip 42 and a passive component 44 are placed on a further outside portion than the interconnect layer in the interconnect layer 20, as second electronic components. The passive component 44 is, for example, a capacitor such as a decoupling capacitor. The IC chip 42 is covered with a sealing resin 54. The passive component 44 is covered with a resin 56 provided on an outside portion of the interconnect layer 20. The resin 56 may be the same resin as the sealing resin 54, or may be different resin.

Furthermore, the interconnect layer 20 is of a multilayer interconnect structure, and has conductor interconnect 26 provided in plural layers and a via plug which connects the conductor interconnects 26 of different layers. The solder ball 60 is connected to the conductor interconnect 26 at the lowermost layer. A part of the solder ball 60 is buried in a solder resist 62. The solder ball 60 functions as an external connection terminal of the electronic device 1.

Figure 2:
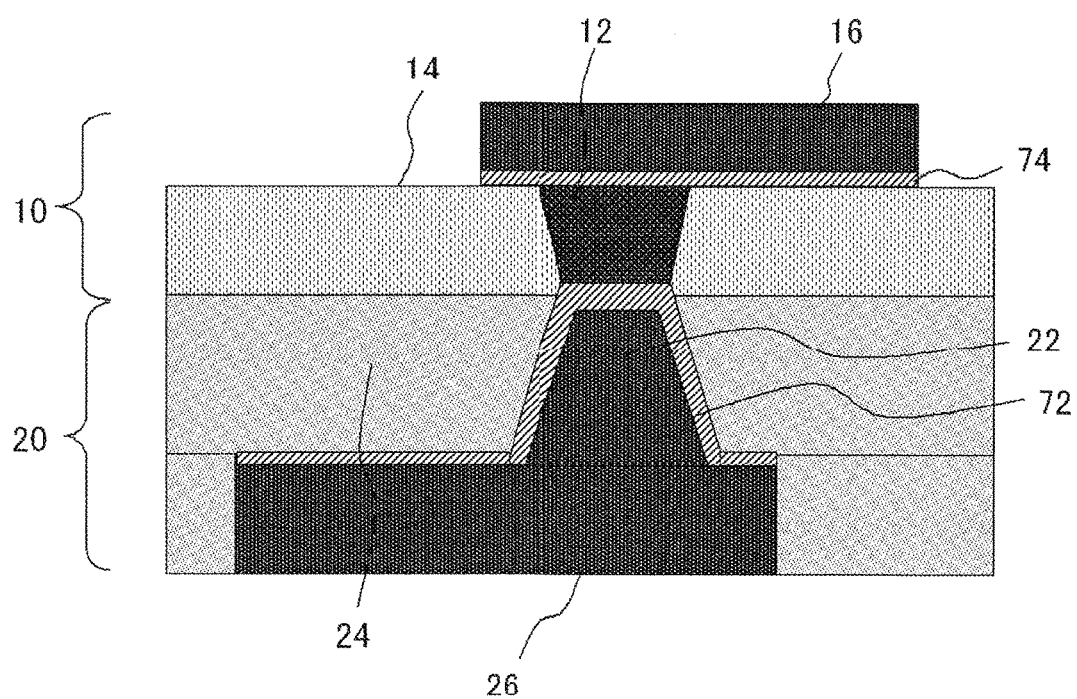
FIG. 2 is a cross-sectional view for explaining an example of a structure in the vicinity of an interface between a first interconnect layer and a second interconnect layer.

Referring to FIG. 2, an example of a structure in the vicinity of an interface between the interconnect layer 10 and the interconnect layer 20 will be described. In this example, an adhesion metal film 72 is formed so as to cover the via plug 22. The adhesion metal film 72 comes in contact with the via plug 12 on the via plug 22. Further, an adhesion metal film 74 is formed also on a surface which comes in contact with the via plug 12 of the conductor interconnect 16.

It is preferable that the adhesion metal films 72 and 74 are a film including Ti (for example, Ti, TiN, TiW, or the like), or a Cr film.

Figure 3A:
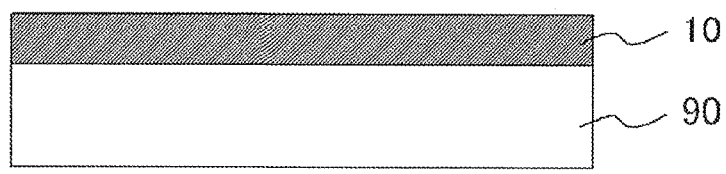
FIGS. 3A to 3E are process views showing a general outline of the first embodiment of a method of manufacturing an electronic device according to the present invention.

Referring to FIGS. 3A to 7, as the first embodiment of a method of manufacturing an electronic device according to the present invention, a method of manufacturing an electronic device 1 will be described. In advance of detail description, an outline of the present manufacturing method will be described using FIGS. 3A to 3E. First, as shown in FIG. 3A, an interconnect layer 10 is formed on a supporting substrate 90 (a first interconnect layer formation process). As the supporting substrate 90, a silicon substrate, a ceramic substrate, a glass substrate, a metal substrate, or the like can be used.

Figure 3B:
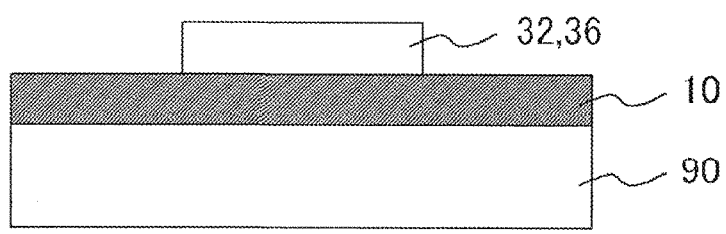
Figure 3C:
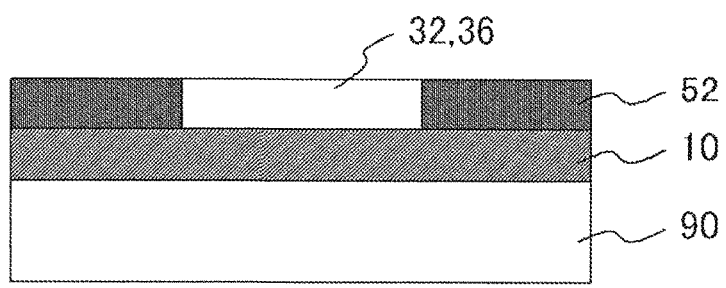
Figure 3D:
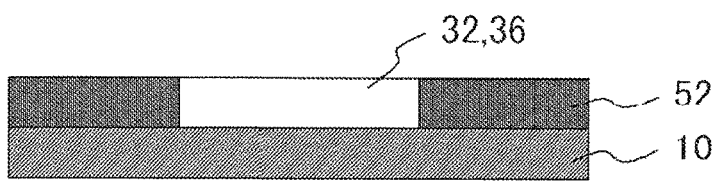
Figure 3E:
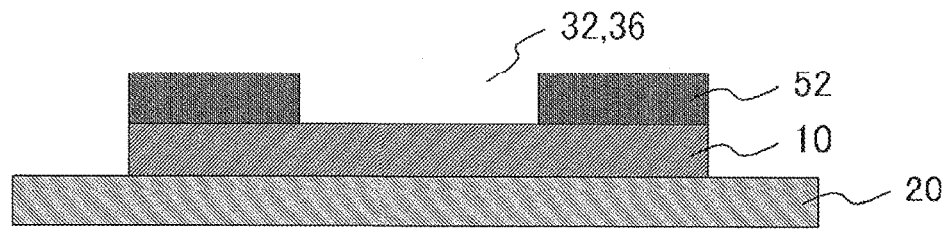

Next, as shown in FIG. 3B, IC chips 32 and 36 are placed on the interconnect layer 10 (an electronic component placing process). Further, as shown in FIG. 3C, a sealing resin 52 is formed on the interconnect layer 10 so as to cover the IC chips 32 and 36 (a sealing resin formation process). Subsequently, as shown in FIG. 3D, the supporting substrate 90 is removed (a supporting substrate removal process). After that, as shown in FIG. 3E, an interconnect layer 20 is formed on an undersurface of the interconnect layer 10 (a second interconnect layer formation process). Last, although not shown in the drawing, the electronic device 1 shown in FIG. 1 is obtained by forming a solder ball 60.

Figure 4A:
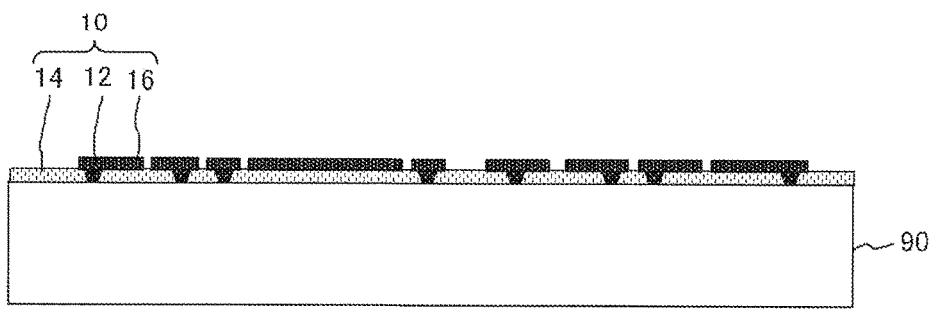
FIGS. 4A and 4B are process views showing the first embodiment of the method of manufacturing the electronic device according to the present invention.
Figure 4B:
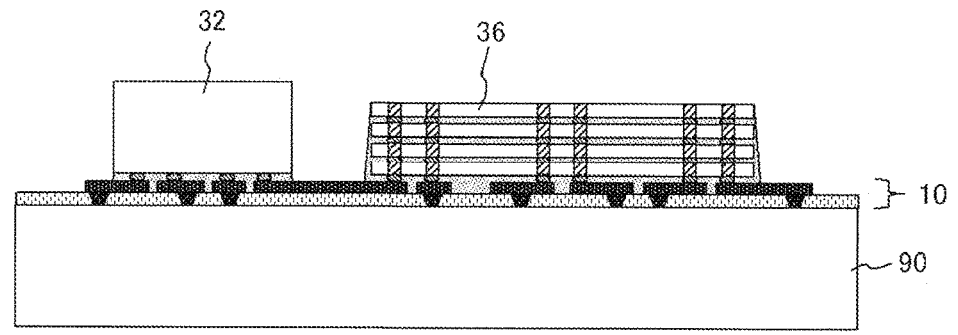
Figure 5A:
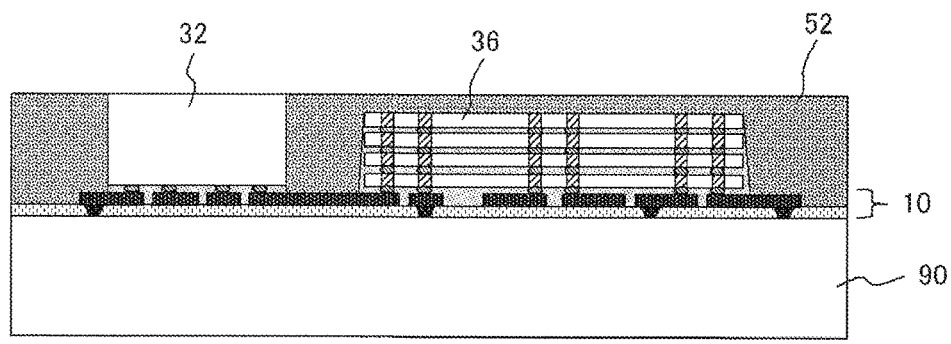
FIGS. 5A and 5B are process views showing the first embodiment of the method of manufacturing the electronic device according to the present invention.
Figure 5B:
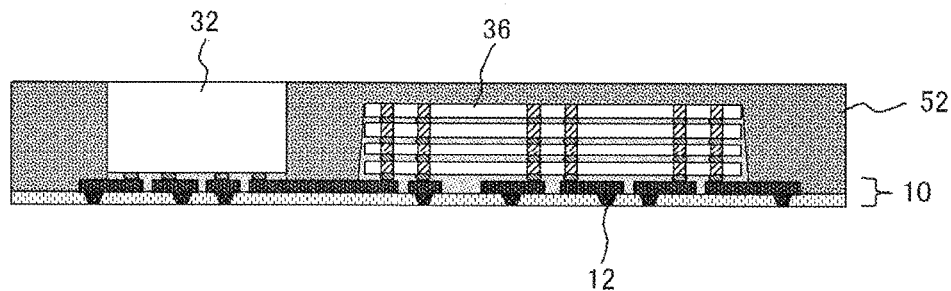

Subsequently, the present manufacturing method will be described using FIGS. 4A to 7. First, an insulation resin 14 is formed on the supporting substrate 90, and a via plug 12 is formed therein. After that, a conductor interconnect 16 is formed on the insulation resin 14 (FIG. 4A). Next, the IC chips 32 and 36 are mounted in a flip chip configuration on the conductor interconnect 16 (FIG. 4B). Subsequently, the sealing resin 52 is formed on the interconnect layer 10 so as to cover the IC chips 32 and 36. Formation of the sealing resin 52 can be performed by, for example, a molding method, a printing method or a potting method (FIG. 5A). After that, the undersurface of the interconnect layer 10 is exposed by removing the supporting substrate 90 (FIG. 5B).

Figure 6A:
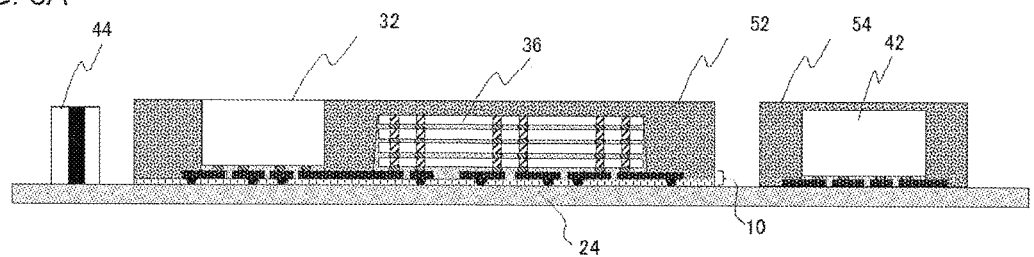
FIGS. 6A and 6B are process views showing the first embodiment of the method of manufacturing the electronic device according to the present invention.
Figure 6B:
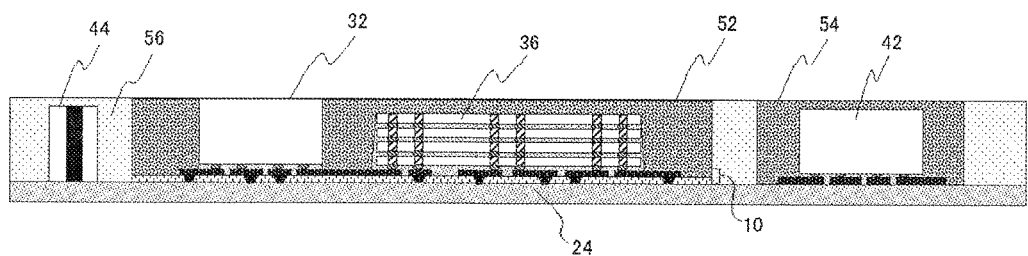

Next, an insulation resin 24 is formed on the undersurface of the interconnect layer 10 so as to extend to further outside than the interconnect layer 10. At this time, for example, an insulation film can be used as the insulation resin 24. Subsequently, an IC chip 42 and a passive component 44 are mounted on a further outside portion than the interconnect layer 10 of the insulation resin 24. After that, a sealing resin 54 is formed so as to cover the IC chip 42 (FIG. 6A). Next, a resin 56 is formed so as to bury a gap formed on the outside portion of the insulation resin 24. This covers the passive component 44 with the resin 56 (FIG. 6B).

Figure 7:
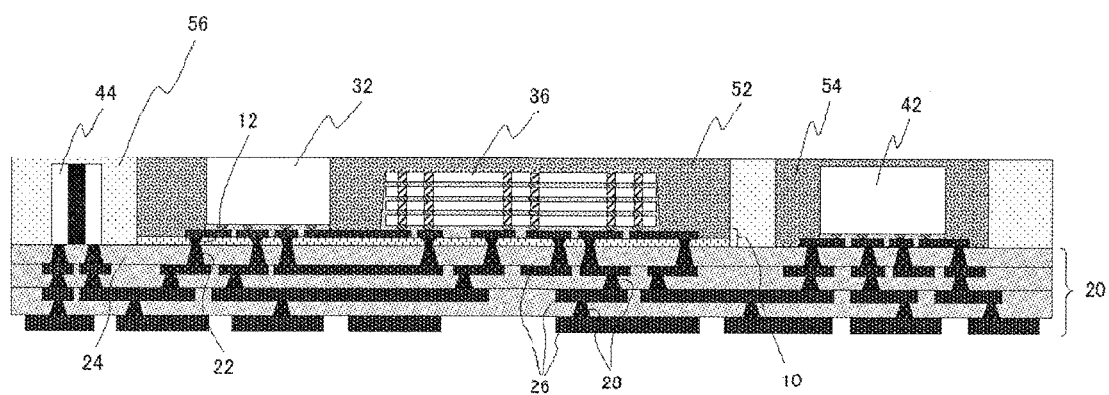
FIG. 7 is a process view showing the first embodiment of the method of manufacturing the electronic device according to the present invention.

Next, a via plug 22 is formed in the insulation resin 24 so as to be connected to the via plug 12. After that, a build-up interconnect layer is formed on the insulation resin 24. For example, a conductor interconnect 26 by a semi-additive method and the via plug 28 by a laser process may be alternatively formed in insulation resin layers such as epoxy resin. This forms the interconnect layer 20 (FIG. 7). After that, the electronic device 1 shown in FIG. 1 can be obtained by forming a solder resist 62 and the solder ball 60. In addition, formation of the interconnect layer 20 may be performed by adhering a preliminarily formed multilayer interconnect layer on the undersurface of the interconnect layer 10 as the interconnect layer 20.

As is apparent from the above description, build-up directions of the interconnect layers 10 and 20 are upward and downward directions in the drawing, respectively. Accordingly, as described above, an end surface on the IC chips 32 and 36 sides of the via plug 12 is larger in area than an end surface on the interconnect layer 20 side, and an end surface on the solder ball 60 side of the via plug 22 is larger in area than an end surface on the interconnect layer 10 side.

Effects of the present embodiment will be described. In the above manufacturing method, the interconnect layer 10 on which the IC chips 32 and 36 are placed is formed on the supporting substrate 90, whereas, the interconnect layer 20 is formed after removing the supporting substrate 90. This can escape from restriction in that, as the insulation resin 24, resin which is lower in decomposition temperature than the insulation resin 14 cannot be used. Therefore, resin suitable for micromachining can be used as the insulation resin 14; on the other hand, resin with relatively low cost can be used as the insulation resin 24. This can implement a method of manufacturing the electronic device 1, which is capable of obtaining microscopic connection between the interconnect layer 10 and the IC chip 32 and 36 with low cost.

Further, the interconnect layer 20 extends to further outside than the interconnect layer 10. This can sufficiently increase an area of a surface (that is, the undersurface of the interconnect layer 20) on which the solder ball 60 is provided, while suppressing the area of the interconnect layer 10 small. Therefore, the electronic device 1 can be easily mounted on other electronic devices, mother boards, and the like without increasing cost. On the other hand, in the case where the interconnect layer 10 and the interconnect layer 20 are equal in area with each other, if the area of the interconnect layer 20 is increased to enhance mountability, accordingly the area of the interconnect layer 10 has to be increased. Then, since relatively expensive resin suitable for micromachining is used for the interconnect layer 10, manufacturing cost of the electronic device 1 increases. On the other hand, if the area of the interconnect layer 10 is decreased to reduce costs, the area of the interconnect layer 20 decreases and mountability is impaired. According to the present embodiment, such dilemma can be solved and a balance between low cost and mountability can be achieved.

Interconnect patterns of the conductor interconnect 16 are formed on the supporting substrate 90 which is high rigidity, and therefore, microscopic conductor interconnect 16 can be obtained. In addition, since the interconnect layer 10 and the IC chips 32 and 36 are bonded on the supporting substrate 90, the interconnect layer 10 and the IC chips 32 and 36 are connected by a bump connection at a microscopic pitch. This leads to reduction in number of the interconnect layers and reduction in size of the IC chips 32 and 36.

Further, since the interconnect layer 20 is formed after removing the supporting substrate 90, the insulation resin 24 which constitutes the interconnect layer 20 can be formed thicker than the insulation resin 14. This enhances stress reduction function of the insulation resin and leads to an improvement in reliability of the electronic device 1.

In the second interconnect layer formation process, the resin which is lower in decomposition temperature than the insulation resin 14 which constitutes the interconnect layer 10 formed in the first interconnect layer formation process is used as the insulation resin 24 which constitutes the interconnect layer 20. This can preferably form the interconnect layer 20 on the interconnect layer 10.

In the electronic device 1, the resin which is lower in decomposition temperature than the insulation resin 14 which constitutes the interconnect layer 10 can be used as the insulation resin 24 which constitutes the interconnect layer 20. Therefore, the resin suitable for micromachining can be used as the insulation resin 14; on the other hand, the resin with relatively low cost can be used as the insulation resin 24. This can implement the electronic device 1, which is capable of obtaining microscopic connection between the interconnect layer 10 and the IC chip 32 and 36 with low cost.

Further, in the electronic device 1, the interconnect layer 10 and the interconnect layer 20 are directly connected, and therefore, a core layer is not provided therebetween. Since it is difficult to achieve miniaturization of the via plug formed in the core layer as compared with a via plug generally formed in a usual interconnect layer, there is a problem in that the entire miniaturization of the electronic device is hindered. In this regard, in the electronic device 1, the core layer is not provided, and therefore, such problem is not generated.

The sealing resin 52 is provided so as to cover the IC chips 32 and 36. With this configuration, the shape of the interconnect body can be maintained even after the supporting substrate 90 is removed. Therefore, the solder ball 60 with high coplanarity can be obtained.

Particularly, in the present embodiment, the resin 56 is formed even on the further outside portion than the interconnect layer 10 of the interconnect layer 20, thereby further enhancing such effect.

In the case where the silicon substrate is used as the supporting substrate 90, influence of thermal expansion can be suppressed small as compared with the case where an insulation substrate is used. With this configuration, miniaturization of connection between the interconnect layer 10 and the IC chips 32 and 36 can be further performed.

In the case where polyimide resin, PBO resin, BCB resin, or cardo resin is used as the insulation resin 14, the insulation resin 14 suitable for micromachining is achieved. In addition, in the case where epoxy resin is used as the insulation resin 24, the insulation resin 24 can be obtained at low cost.

An adhesion metal film 72 is provided so as to cover the via plug 22 (see FIG. 2). This can obtain strong conjunction between the via plug 22 and the insulation resin 24. In addition, an adhesion metal film 74 is provided on a surface which comes in contact with the via plug 12 of the conductor interconnect 16 (see FIG. 2). This can obtain strong conjunction between the conductor interconnect 16 and the insulation resin 14. This contributes to an improvement in reliability of the electronic device 1. In the case where the adhesion metal films 72 and 74 include Ti, or the adhesion metal films are made of Cr; especially high adhesiveness to the resin can be obtained.

The IC chip 42 and the passive component 44 can be placed on the further outside portion than the interconnect layer 10 in the interconnect layer 20. This can further increase in function and performance of the electronic device 1.

Second Embodiment

Figure 8:
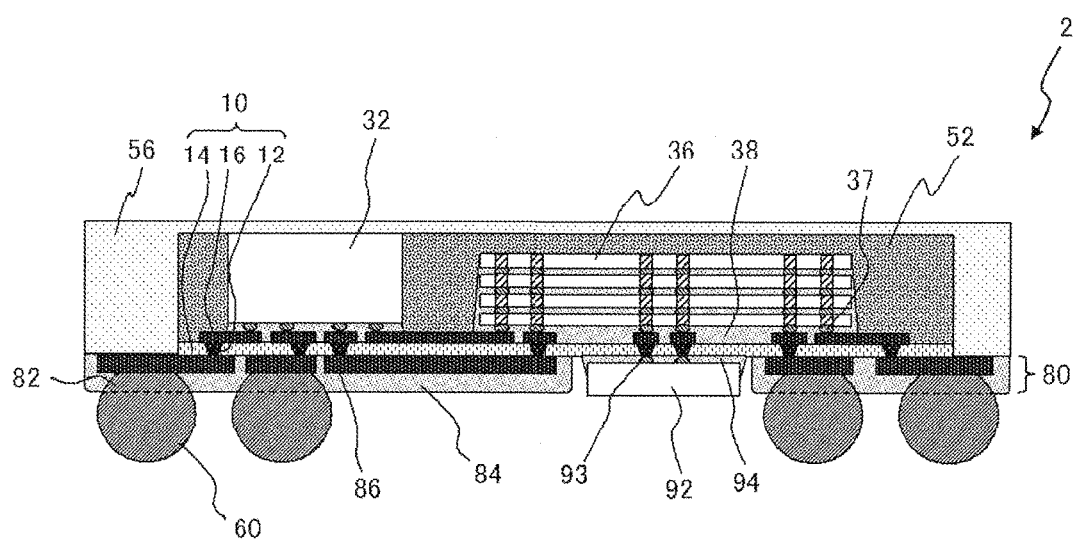
FIG. 8 is a cross-sectional view showing a second embodiment of an electronic device according to the present invention.

FIG. 8 is a cross-sectional view showing a second embodiment of an electronic device according to the present invention. The electronic device 2 includes an interconnect layer 10 (a first interconnect layer) and interconnect layer 80 (a second interconnect layer). Configuration of the interconnect layer 10 is the same as that described in FIG. 1.

The interconnect layer 80 is formed on an undersurface of the interconnect layer 10 and extended to further outside than the interconnect layer 10. The interconnect layer 80 has a solder resist 84 and conductor interconnect 86 formed therein. Resin which is lower in decomposition temperature than an insulation resin 14 is used as the solder resist 84. A via plug 82 (a second conductive plug) is formed in the interconnect layer 80. The via plug 82 corresponds to a portion buried in a part of a solder ball 60, specifically in the solder resist 84 in the solder ball 60. As can be seen from the drawing, the via plug 82 is of a tapered shape which becomes smaller in diameter as approaching to the interconnect layer 10. Therefore, an end surface area on the interconnect layer 10 side of the via plug 82 is smaller than an end surface area opposite thereto.

Further, an IC chip 92 is mounted in a flip chip configuration on an undersurface of the interconnect layer 10. That is, the IC chip 92 is connected to the undersurface via a bump 93, and underfill resin 94 is filled in a gap between the interconnect layer 10 and the IC chip 92.

A resin 56 is formed on a further outside portion than the interconnect layer 10 in the interconnect layer 80. In the present embodiment, the resin 56 covers side surfaces and an upper surface of a sealing resin 52.

Figure 9A:
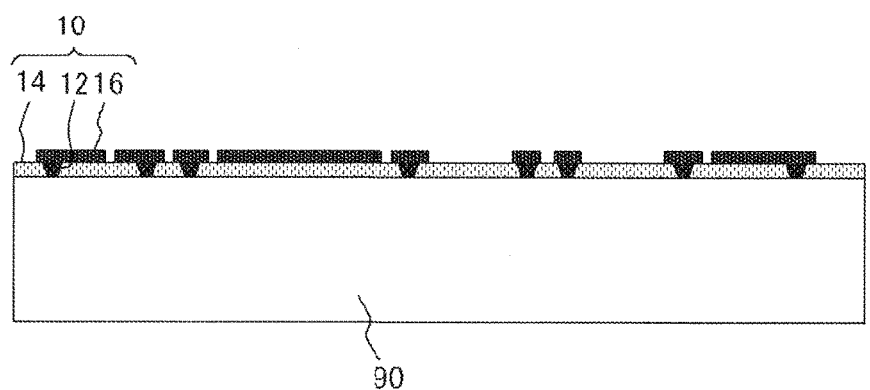
FIGS. 9A and 9B are process views showing the second embodiment of a method of manufacturing an electronic device according to the present invention.
Figure 9B:
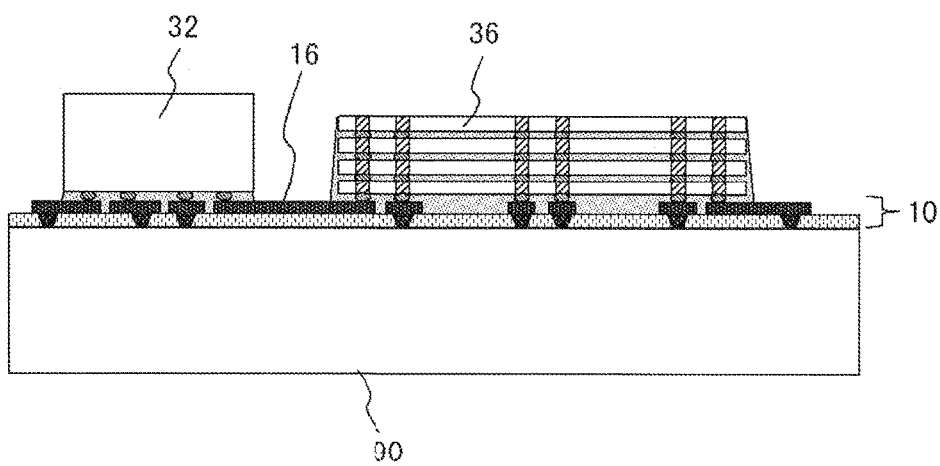

Referring to FIGS. 9A to 12B, as the second embodiment of a method of manufacturing an electronic device according to the present invention, a method of manufacturing an electronic device 2 will be described. First, an insulation resin 14, a via plug 12, and conductor interconnect 16 are formed on a supporting substrate 90 (FIG. 9A). Subsequently, IC chips 32 and 36 are mounted in a flip chip configuration on the conductor interconnect 16 (FIG. 9B).

Figure 10A:
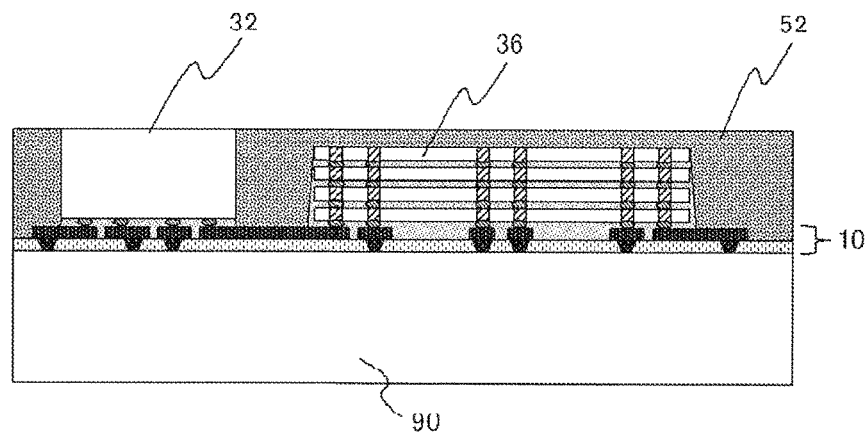
FIGS. 10A to 10C are process views showing the second embodiment of the method of manufacturing the electronic device according to the present invention.
Figure 10B:
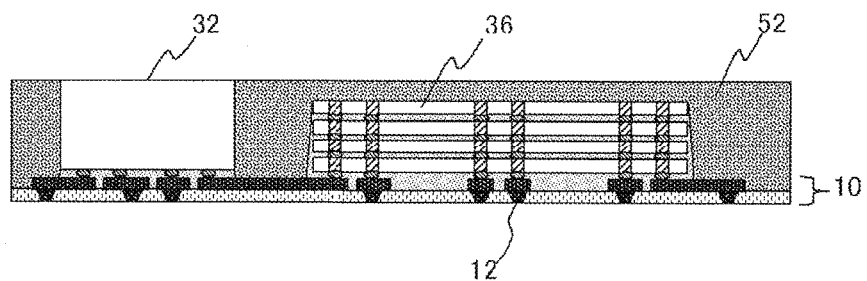
Figure 10C:
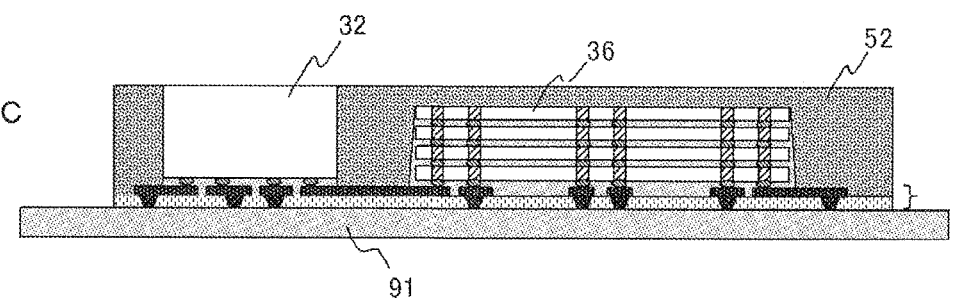

Next, a sealing resin 52 is formed on an interconnect layer 10 so as to cover the IC chips 32 and 36 (FIG. 10A). After that, an undersurface of the interconnect layer 10 is exposed by removing the supporting substrate 90 (FIG. 10B). Subsequently, a supporting seat 91 is formed on the undersurface of the interconnect layer 10 so to extend to further outside than the interconnect layer 10 (FIG. 10C).

Figure 11A:
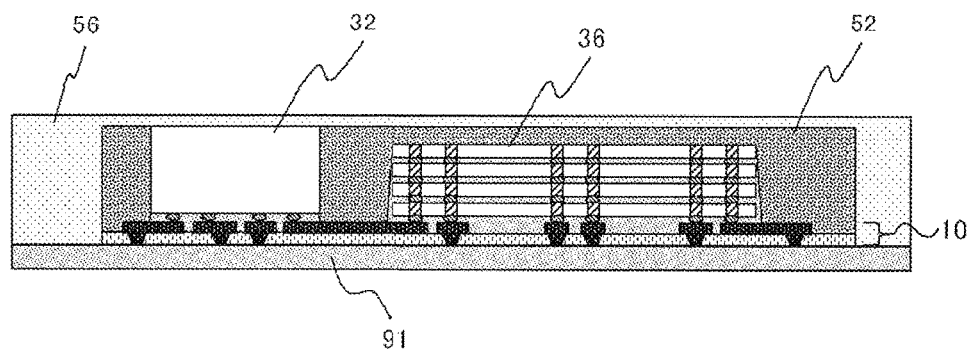
FIGS. 11A and 11B are process views showing the second embodiment of the method of manufacturing the electronic device according to the present invention.
Figure 11B:
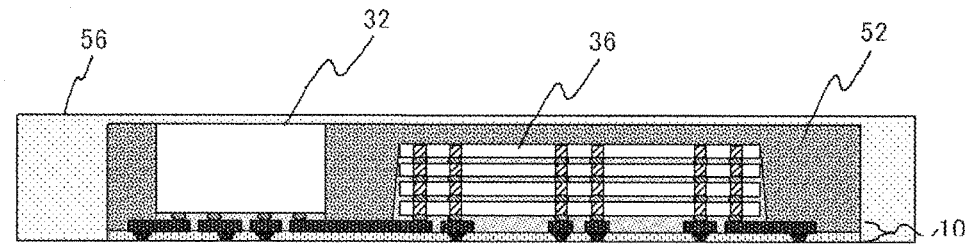
Figure 12A:
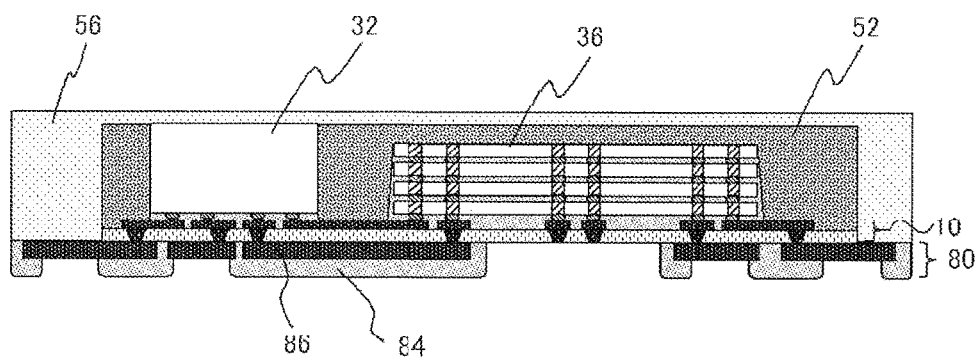
FIGS. 12A and 12B are process views showing the second embodiment of the method of manufacturing the electronic device according to the present invention.
Figure 12B:
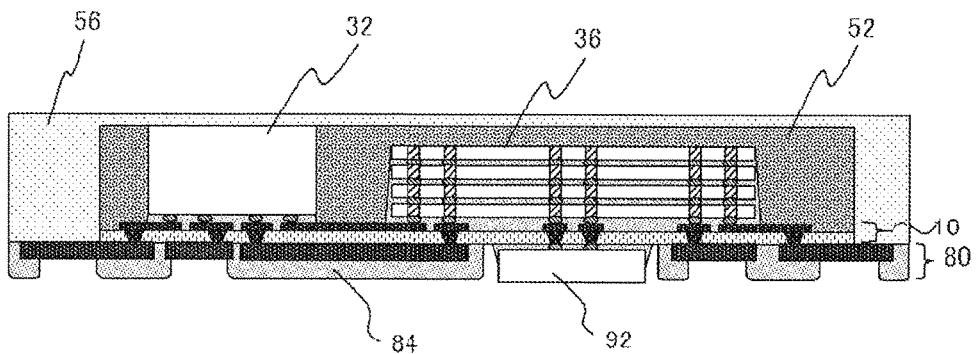

Next, a resin 56 is formed on a further outside portion than the interconnect layer 10 of the supporting seat 91 by covering the sealing resin 52 (FIG. 11A). After that, the supporting seat 91 is separated (FIG. 11B). Next, conductor interconnect 86 is formed on the undersurface of the interconnect layer 10, and then, a solder resist 84 is formed so as to cover the conductor interconnect 86. Further, patterning of the solder resist 84 is performed, and a portion where a solder ball 60 is formed and a portion where an IC chip 92 is mounted are opened (FIG. 12A). This forms an interconnect layer 80. Subsequently, the IC chip is mounted in a flip chip configuration on the undersurface of the interconnect layer 10 (FIG. 12B). After that, the electronic device 2 shown in FIG. 8 can be obtained by forming the solder ball 60.

The present embodiment can exhibit the following effect in addition to the effects of the above described first embodiment. The solder resist 84 is used as the resin which constitutes the interconnect layer 80, and therefore, the electronic device 2 can be further reduced in cost. Further, the electronic component (IC chip 92) is mounted not only on an upper surface of the interconnect layer 10 but also on the under surface thereof, whereby the electronic device 2 can be further increased in function and performance.

Third Embodiment

Figure 13:
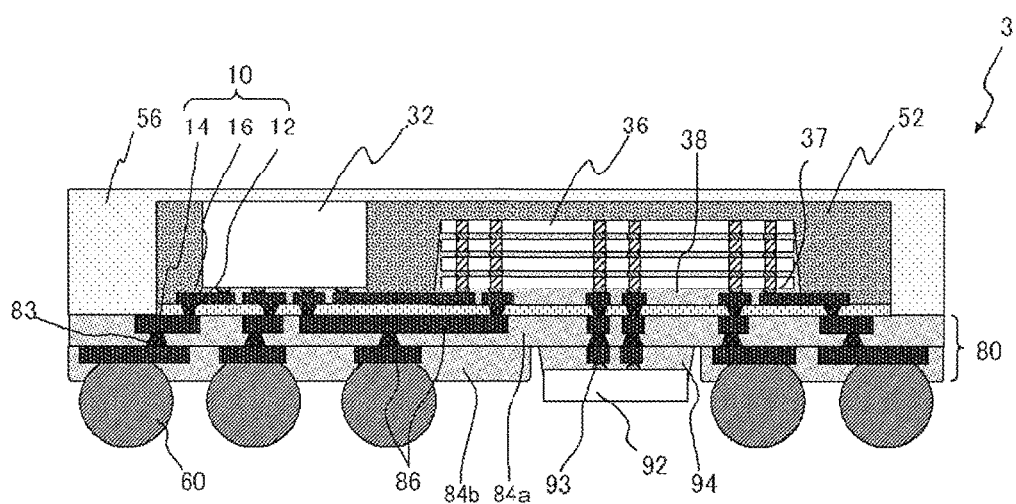
FIG. 13 is a cross-sectional view showing a third embodiment of an electronic device according to the present invention.

FIG. 13 is a cross-sectional view showing a third embodiment of an electronic device according to the present invention. The electronic device 3 includes an interconnect layer 10 and an interconnect layer 80. The electronic device 3 is different from the electronic device 2 shown in FIG. 8 in that the interconnect layer 80 has a multilayer interconnect structure. In the present embodiment, the interconnect layer 80 includes an insulation resin 84a provided on an undersurface of the interconnect layer 10 and a solder resist 84b provided thereon.

In the interconnect layer 80 of the present embodiment, conductor interconnect 86 provided in plural layers and a via plug 83 (a second conductive plug) connected to the conductor interconnect 86 are formed. As can be seen from the drawing, the via plug 83 is of a tapered shape which becomes smaller in diameter as approaching to the interconnect layer 10. Therefore, an end surface area on the interconnect layer 10 side of the via plug 83 is smaller than an end surface area opposite thereto. In addition, the bump 93 is directly connected to the via plug 12 in the electronic device 2, whereas, a bump 93 is connected to a via plug 12 via the conductor interconnect 86 (and the via plug 83) in the electronic device 3. Other configuration of the electronic device 3 is the same as the electronic device 2.

Figure 14A:
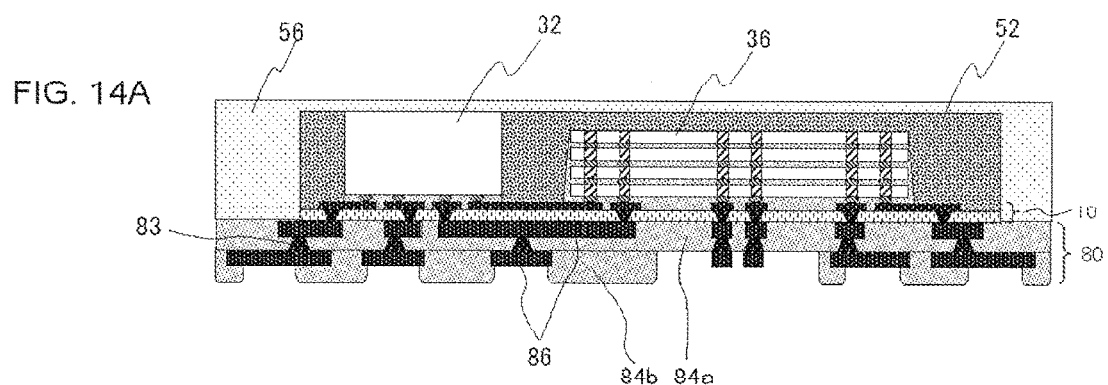
FIGS. 14A and 14B are process views showing the third embodiment of a method of manufacturing an electronic device according to the present invention.
Figure 14B:
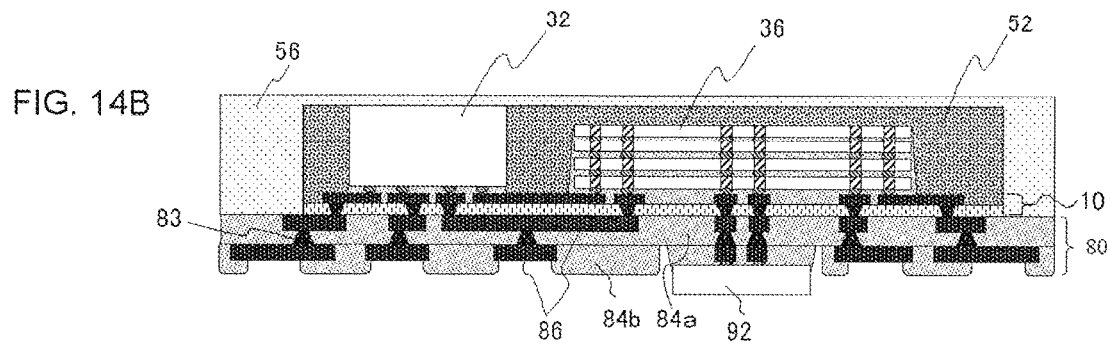

Referring to FIGS. 14A and 14B, as the third embodiment of a method of manufacturing an electronic device according to the present invention, a method of manufacturing an electronic device 3 will be described. First, a structure shown in FIG. 11B is prepared as described in FIGS. 9A to 11B.

Next, a first layer conductor interconnect 86 is formed on an undersurface of the interconnect layer 10 so as to be connected to a via plug 12. After that, an insulation resin 84a is formed so as to cover the first layer conductor interconnect 86. Further, a via plug 83 is formed so as to be connected to the conductor interconnect 86 in the insulation resin 84a. Subsequently, a second layer conductor interconnect 86 is formed on the insulation resin 84a so as to be connected to the via plug 83. After that, a solder resist 84b is formed so as to cover the second layer conductor interconnect 86.

Next, patterning of the solder resist 84b is performed, and a portion where a solder ball 60 is formed and a portion where an IC chip 92 is mounted are opened (FIG. 14A). This forms an interconnect layer 80. Subsequently, the IC chip 92 is mounted in a flip chip configuration on the insulation resin 84a (FIG. 14B). After that, the electronic device 3 shown in FIG. 13 can be obtained by forming the solder ball 60. The same effects as the second embodiment can be exhibited even in the present embodiment.

The electronic devices and the methods of manufacturing the same according to the present invention are not limited to the above embodiments, but, various modifications can be made. For example, in the above embodiments, the IC chip is exemplified as the electronic component placed on the upper surface or the undersurface of the interconnect layer 10; however, the electronic component may be a passive component such as a capacitor. In addition, it is not necessary to provide the electronic component in the electronic device.

In the above embodiments, the example in which the solder ball is provided in the electronic device; however, it is not necessary to provide the solder ball. In the case where the solder ball is not provided, a land portion of the conductor interconnect corresponds to an external electrode terminal. When the electronic device 1 shown in FIG. 1 is taken for an example, a portion where the solder ball 60 is connected in the conductor interconnect 26 is a land portion.

Figure 15:
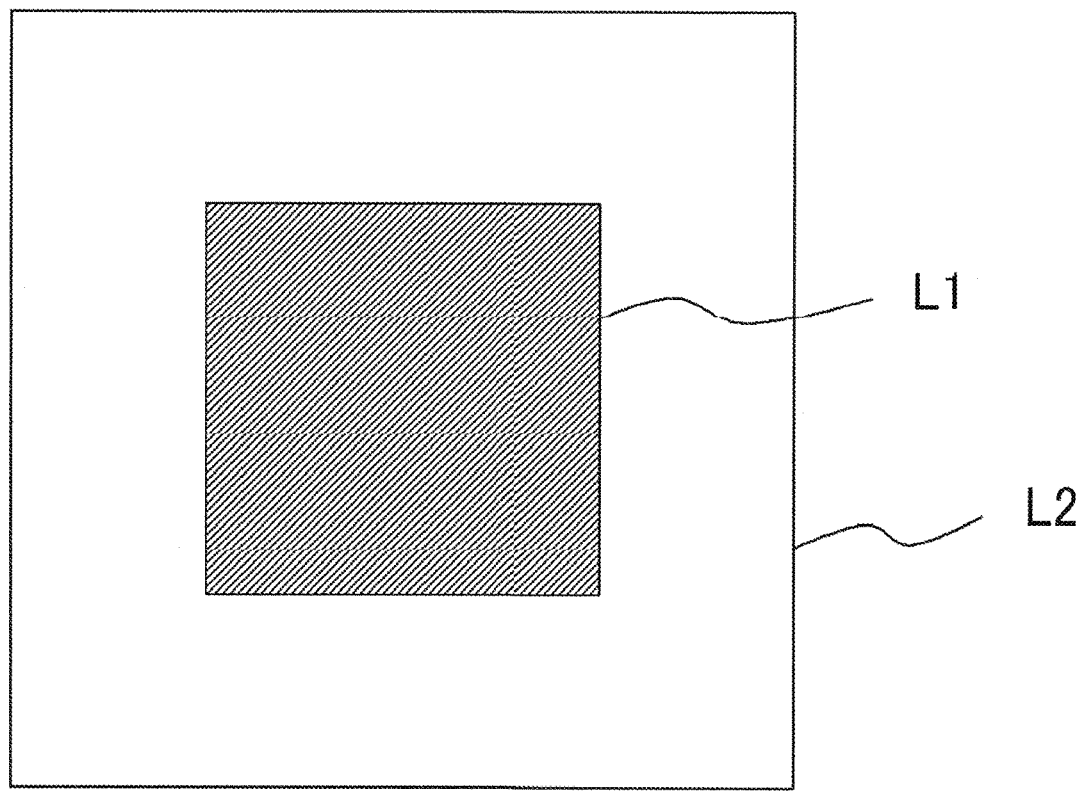
FIG. 15 is a plan view for explaining a modified example of an embodiment.
Figure 16A:
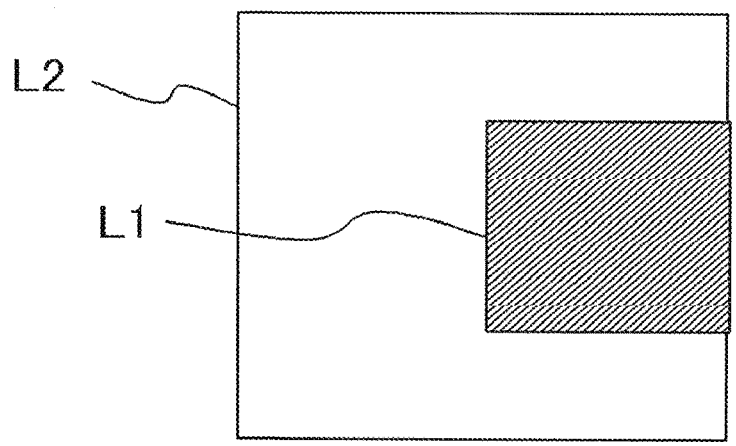
FIGS. 16A to 16C are plan views for explaining modified examples of embodiments.
Figure 16B:
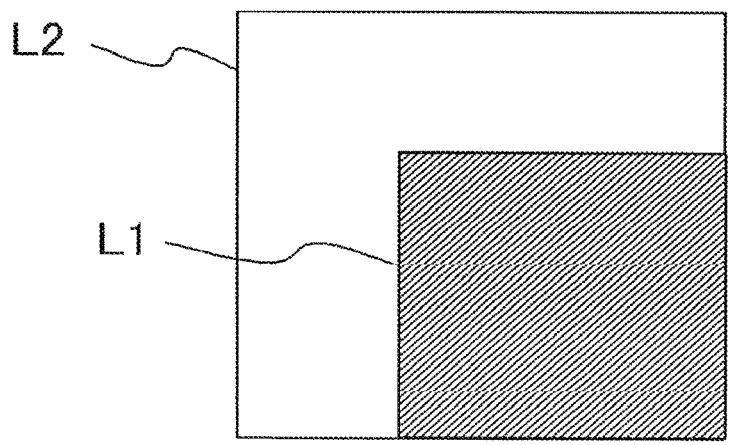
Figure 16C:
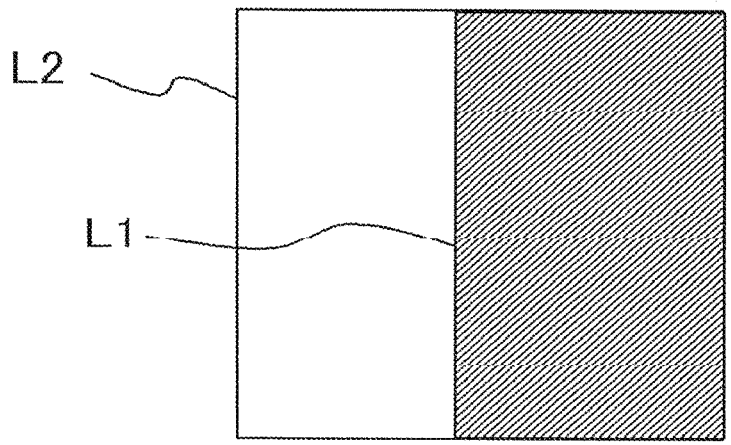

In addition, the second interconnect layer may be protruded from the whole periphery of the first interconnect layer, or may be protruded from only one part thereof. The former example is shown in FIG. 15, and the latter example is shown in FIGS. 16A to 16C. In these plan views, outer peripheries of the first and the second interconnect layers are shown by lines L1 and L2, respectively; and a portion where both interconnect layers are overlapped are shaded. In FIG. 15, the second interconnect layer is protruded from all four sides of the first interconnect layer. On the other hand, in FIG. 16A, FIGS. 16B, and 16C, the second interconnect layers are protruded from three sides, two sides, and one side of the first interconnect layers, respectively.

It is apparent that the present invention is not limited to the above embodiment, and may be modified and changed without departing from the scope and spirit of the invention.

What is claimed is:

1. A semiconductor device comprising:
    a first wiring substrate having a first obverse surface, a first reverse surface opposite the first obverse surface, a plurality of first wirings formed in the first wiring substrate, and a plurality of external electrodes formed on the first reverse surface;
    a second wiring substrate arranged as an interposer having a second obverse surface, a second reverse surface opposite the second obverse surface, and a wiring layer arranged closer to the second obverse surface than the second reverse surface, the second wiring substrate disposed on the first obverse surface of the first wiring substrate such that the second reverse surface faces the first obverse surface of the first wiring substrate;
    a first semiconductor chip having a first main surface, a first rear surface opposite the first main surface, and a plurality of first electrodes formed on the first main surface, the first semiconductor chip mounted on the second obverse surface of the second wiring substrate such that the first main surface faces the second obverse surface of the second wiring substrate via a first underfill material; and
    a second semiconductor chip having a second main surface and a plurality of second electrodes formed on the second main surface, the second semiconductor chip mounted side by side with the first semiconductor chip on the second obverse surface of the second wiring substrate such that the second main surface faces the second obverse surface of the second wiring substrate via a second underfill material.

2. The semiconductor device according to claim 1, wherein each of the plurality of external electrodes of the first wiring substrate is a solder ball.

3. The semiconductor device according to claim 2, wherein, in a cross section view, a thickness of the first semiconductor chip is larger than a thickness of the second wiring substrate in a thickness direction of the second wiring substrate, and
    wherein, in the cross section view, a thickness of the second semiconductor chip is larger than the thickness of the second wiring substrate in the thickness direction.

4. The semiconductor device according to claim 3,
wherein an overall area of the first wiring substrate is greater than an overall area of the second wiring substrate in a plan view,
wherein the first obverse surface of the first wiring substrate has a first area and a second area outside the first area in the plan view, and
wherein the second wiring substrate is arranged within the first area and a passive component is mounted within the second area in the cross section view.

5. The semiconductor device according to claim 4, wherein a third semiconductor chip is mounted within the second area of the first wiring substrate in the cross section view.

6. The semiconductor device according to claim 2,
wherein the first semiconductor chip includes a plurality of memory chips which are laminated with each other via a third underfill material,
wherein each of the plurality of memory chips has a first side surface between the first main surface and the first rear surface, and
wherein the first side surface of each of the plurality of memory chips is covered with a first resin.

7. The semiconductor device according to claim 6,
wherein the plurality of memory chips include a first memory chip which has a first surface, a second surface opposite the first surface and a plurality of through electrodes penetrating the first memory chip from the first surface to the second surface in a thickness direction of the second wiring substrate, and
wherein a thickness of the second wiring substrate is larger than a thickness of the first memory chip in the thickness direction.

8. The semiconductor device according to claim 6,
wherein the second semiconductor chip includes a second side surface between the second obverse surface and the second rear surface,
wherein the second side surface of the second semiconductor chip faces the first side surface of each of the plurality of memory chips,
wherein a second resin is filled between the second side surface of the second semiconductor chip and the first side surface of each of the plurality of memory chips in the cross section view, and
wherein the second rear surface of the second semiconductor chip is not covered with the second resin in the cross section view.

9. The semiconductor device according to claim 6,
wherein, in the cross section view, a thickness of the second semiconductor chip is larger than a thickness of the first semiconductor chip in a thickness direction of the second wiring substrate.

10. A semiconductor device comprising:
a first wiring substrate having a first obverse surface, a first reverse surface opposite the first obverse surface, a plurality of first wirings formed in the first wiring, and a plurality of solder balls formed on the first reverse surface;
a second wiring substrate as an interposer having a second obverse surface, a second reverse surface opposite the second obverse surface and a first wiring layer arranged closer to the second obverse surface than the second reverse surface,
the second wiring substrate disposed on the first obverse surface of the first wiring substrate such that the second reverse surface faces the first obverse surface of the first writing substrate;
a first semiconductor chip having a first main surface, a second rear surface opposite the first main surface and a plurality of first bump electrodes formed on the first main surface,
the first semiconductor chip mounted on the second obverse surface of the second wiring substrate such that the first main surface faces the second obverse surface of the second wiring substrate via a first underfill material; and
a second semiconductor chip having a second main surface, a second rear surface opposite the second main surface and a plurality of second bump electrodes formed on the second main surface,
the second semiconductor chip mounted side by side with the first semiconductor chip on the second obverse surface of the second wiring substrate such that the second main surface faces the second obverse surface of the second wiring substrate via a second underfill material,
wherein, in a cross section view, a thickness of the first semiconductor chip is larger than a thickness of the second wiring substrate in a thickness direction of the second wiring substrate, and
wherein, in the cross section view, a thickness of the second semiconductor chip is larger than the thickness of the second wiring substrate in the thickness direction.

11. The semiconductor device according to claim 10,
wherein an overall area of the first wiring substrate is greater than an overall area of the second wiring substrate in a plan view,
wherein the first obverse surface of the first wiring substrate has a first area and a second area outside the first area in the plan view, and
wherein the second wiring substrate is arranged within the first area and a passive component is mounted within the second area in the cross section view.

12. The semiconductor device according to claim 11, wherein a third semiconductor chip is mounted within the second area of the first wiring substrate in the cross section view.

13. The semiconductor device according to claim 10,
wherein the first semiconductor chip includes a plurality of memory chips which are laminated with each other via a third underfill material,
wherein each of the plurality of memory chips has a first side surface between the first main surface and the first rear surface, and
wherein the first side surface of each of the plurality of memory chips is covered with a first resin.

14. The semiconductor device according to claim 13,
wherein the plurality of memory chips include a first memory chip which has a first surface, a second surface opposite the first surface and a plurality of through electrodes penetrating the first memory chip from the first surface to the second surface in the thickness direction, and
wherein the thickness of the second wiring substrate is larger than a thickness of the first memory chip in the thickness direction.

15. The semiconductor device according to claim 13,
wherein the second semiconductor chip includes a second side surface between the second obverse surface and the second rear surface,
wherein the second side surface of the second semiconductor chip faces the first side surface of each of the plurality of memory chips, wherein a second resin is filled between the second side surface of the second semiconductor chip and the first side surface of each of the plurality of memory chips in the cross section view, and wherein the second rear surface of the second semiconductor chip is not covered with the second resin in the cross section view.

16. The semiconductor device according to claim 15, wherein, in the cross section view, the thickness of the second semiconductor chip is larger than the thickness of the first semiconductor chip in the thickness direction.

* * * * *